United States Patent [19]

Gleim et al.

[11] Patent Number: 4,524,121

[45] Date of Patent: Jun. 18, 1985

[54] POSITIVE PHOTORESISTS CONTAINING PREFORMED POLYGLUTARIMIDE POLYMER

[75] Inventors: Robert D. Gleim, Newtown; Mark P. de Grandpre, Ambler, both of Pa.

[73] Assignee: Rohm and Haas Company, Philadelphia, Pa.

[21] Appl. No.: 553,221

[22] Filed: Nov. 21, 1983

[51] Int. Cl.$^3$ .................... G03C 1/54; G03C 1/68; G03C 5/00

[52] U.S. Cl. .................... 430/176; 430/156; 430/192; 430/270; 430/313; 430/326

[58] Field of Search .............. 430/192, 270, 156, 326, 430/313, 176

[56] References Cited

U.S. PATENT DOCUMENTS

| | | | |
|---|---|---|---|
| 3,964,908 | 6/1976 | Bargon et al. | 430/296 |
| 4,079,041 | 3/1978 | Baumann et al. | 430/270 X |
| 4,121,936 | 10/1978 | Matsuda et al. | 430/270 |
| 4,246,374 | 1/1981 | Kopchik | 525/80 X |
| 4,254,232 | 3/1981 | Mueller | 525/96 X |
| 4,379,874 | 4/1983 | Stoy | 525/94 X |

*Primary Examiner*—John E. Kittle
*Assistant Examiner*—Mukund J. Shah
*Attorney, Agent, or Firm*—Marc S. Adler

[57] ABSTRACT

This invention relates to a positive photoresist system possessing a high degree of thermal stability. The photoresist system contains a preformed polyglutarimide polymer dissolved in a non-reacting solvent. The positive resist is capable of achieving high resolution images by exposure to a wide range of wavelengths and development using an aqueous base developer. The photoresist system is also suitable for use as a planarizing layer in a multiple layer system.

30 Claims, No Drawings

POSITIVE PHOTORESISTS CONTAINING PREFORMED POLYGLUTARIMIDE POLYMER

FIELD OF THE INVENTION

This invention relates to a positive photoresist system, and more particularly, to a positive photoresist system possessing a high degree of thermal stability, resolution over a wide range of exposing radiation wavelengths, and other properties useful for forming an image on a substrate. The photoresist system of the invention is also useful as a planarizing layer in a multilayer resist system.

BACKGROUND OF THE INVENTION

Positive-acting photoresists, commonly referred to as postive photoresists, or positive resists, are useful for forming images on surfaces in lithographic and semiconductor processes. Typically, positive photoresist systems contain a mixture of a photoactive sensitizing compound or sensitizer, a coupler resin, and optionally minor amounts of additives, dissolved in a single solvent or mixed solvent system. The photoresist system must be capable of being applied as a thin adherent layer or film, having a thickness of about 0.5 to about 3 micrometers, on the surface of a base material such as a silicon wafer or printed circuit board. After the film or resist layer is dried to remove the solvent, a photomask with opaque image areas, delineating the desired pattern or circuitry to be imaged onto the surface, is brought into close contact with the photoresist film. When the photomask is in position, the positive photoresist layer, not covered or blocked by the photomask, is exposed to a source of energy, such as ultraviolet, visible light, X-ray, electron beam or other electromagnetic radiation. The positive photoresist layer exposed to the radiation undergoes a chemical change which renders the exposed layer more soluble in a developing solution, such as an aqueous base, than the unexposed portion of the photoresist layer.

The coupler resin in a positive resist system is selected because of its solubility in a solvent, as well as in a developing solution, and on its ability to form an adherent film on a substrate. The solubility of the coupler resin in a developing solution is inhibited by the presence of the photoactive sensitizer compound. The sensitizer, in the areas not exposed to the radiation, is not soluble in the developing solution. The sensitizer compound, however, undergoes a chemical reaction upon absorption of the exposing radiation. The exposed sensitizer is at least partially converted to a compound which is soluble in the developing solution. Based on the difference in the dissolution rate of the unexposed film and the exposed film, the developing solution preferentially dissolves the exposed areas of the photoresist film. Following this developing step, the substrate has been imaged and is ready for circuitry to be placed on the surface in the imaged or developed areas. Subsequently, the unexposed photoresist is stripped from the surface by a stripping solution.

Therefore, the coupler resin, sensitizer, solvent, developing solution and stripping solution are selected based on their compatibility and effectiveness as components in an efficient and accurate imaging process.

The coupler resin serves to provide adhesion of the coating to the surface, to fortify the coating for better chemical resistance, to reduce the tendency for the sensitizer to precipitate from the coating, to increase the viscosity and coating characteristics of the photoresist film, and to reduce the cost of the photoresist sytem. Generally, for aqueous base developed systems, the resins are not photosensitive and are not extremely hydrophobic, but dissolve slowly in aqueous base and are resistant to acids. If the resin dissolves too rapidly in aqueous alkaline solutions, however, the unexposed areas of the film can be leached away during developing and no useful image can be formed. The resin therefore must be as hydrophobic as possible and yet remain capable of being dissolved in aqueous alkaline developing solutions. Resins containing phenols, ethers formed from phenols, and aromatic amines have been used in positive photoresist systems containing photoactive sensitizing compounds.

A typical conventional coupler resin is a low molecular weight, on the order of about 3000 to about 5000 weight average molecular weight, condensation polymer of a phenol, such as cresol, and formaldehyde. Typical sensitizers used with such coupler resins are derivatives of compounds variously called diazo oxides or orthoquinone diazides prepared in either naphthalene or benzene forms. The selection of a suitable non-reacting solvent for the resin and sensitizer is critical in the formation of a uniform coating or film and in the prevention of the sensitizer from crystallizing and precipitating from the system.

DESCRIPTION OF THE PRIOR ART

The background, types and operation of conventional photoresists are described in W. S. DeForest, *Photoresist Materials and Processes,* McGraw-Hill, 1975. In order to understand the factors which are important in formulating and evaluating a positive photoresist system, the advantages and disadvantages of a typical positive photoresist sytem, containing a commercial coupler resin, will be described. Novolak is a generic term used to identify low molecular weight condensation polymers of phenols, such as cresol, and formaldehyde having repeating units of the following chemical structure:

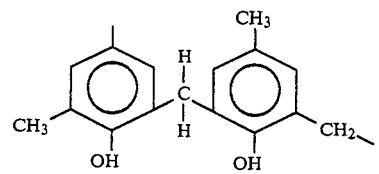

On a solids basis, a conventional photoresist system contains about 75 percent by weight of the solids, a novolak coupler resin and about 25 percent of the solids of a sensitizer dissolved in a solvent system.

A typical positive acting sensitizer, useful with coupler resins such as novolak, is a naphthalene diazoketone or napthoquinone diazide formed by reacting napthoquinone-1,2-diazide-5-sulfochloride, having the following chemical structure:

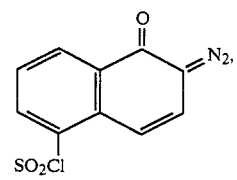

(formula R)

with trihydroxy benzophenone to form a mixture of primary, secondary and tertiary substituted sulfonate esters having the structural formula

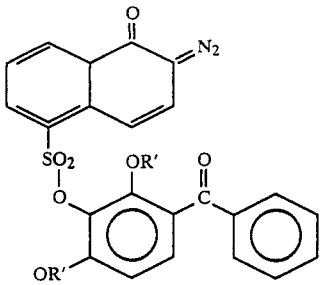

where R' is a hydrogen or the naphthaquinone-1,2-diazide-5-sulfonate ester. This mixture primarily containing the triester is referred to herein as "SOX". Sensitizer compounds are often referred to as inhibitors because they act to inhibit the rate of dissolution of the unexposed resin in the developer. Sensitizers can also be referred to as accelerators because upon exposure they increase the dissolution rate of the exposed film in the developer.

A suitable solvent for this novolak resin/sensitizer mixture is a mixture of cellosolve acetate (ethylene glycol monoethylether acetate), xylene and butyl acetate in a weight ratio of about 80/10/10 (hereinafter referred to as "Conventional Solvent" or "CS")

The conventional positive photoresist is typically deposited as a film from the solvent onto a substrate, such as a silicon wafer, by spin casting the photoresist sytem. The solvent in the system which does not evaporate at the ambient spinning conditions is subsequently removed by a "soft-bake" of the film at about 90° C. for about one half an hour. The photoresist film is then exposed, through the photomask at ambient temperatures, to a source of radiation such as "near" UV. The terms "near", "mid" and "deep" UV, as used herein, refer to ultraviolet light having the following range of wavelengths: near UV being greater than about 330 nanometers and less than about 450 nanometers, mid UV being from about 280 nanometers to 330 nanometers, and deep UV being from about 200 nanometers to 280 nanometers.

The positive photoresist film exposed to the radiation undergoes a chemical change that increases the rate of dissolution of the exposed areas in an aqueous developing solution, preferably an aqueous base. This chemical change is caused by the conversion of the sensitizer to an aqueous base soluble form. Upon absorption of the radiation, the sensitizer breaks down forming a ketene with nitrogen gas being evolved. The ketene is then converted to an aqueous base soluble compound having a carboxylic acid group either by reaction with ambient water or by the formation of a lactone with unexposed sensitizer molecules, the lactone ring being further broken down in the presence of the aqueous base developing solution to the carboxylic acid form. By either mechanism, the exposed areas of the film becomes soluble in an aqueous base developing solution. The difference in the dissolution rate between the exposed film and the unexposed film in the developing solution determines the effectiveness of the system without reducing the thickness of the unexposed film to an unacceptable level.

Such conventional positive photoresist systems based on phenolic (novolak) coupler resins suffer from a number of drawbacks. The low thermal stability of such coupler resins is a major disadvantage because the photoresist layer on a silicon wafer is subjected to high temperatures during processing. If the processing temperature exceeds the glass transition temperature of the coupler resin, the unexposed photoresist layer will begin to melt or flow. Flow of the resist layer reduces the area between the exposed film areas and leads to reduced image resolution. In order to attempt to minimize flow problems, hardening of the exposed photoresist layer before the application of high temperatures has been employed. Novolak type resists are hardened by crosslinking the unexposed resist either by a gradual post baking, known as ramped post bake, or by exposing the unexposed resist to deep UV. (See Hiraoka, et al, *J. Vac. Sci. Tech.*, 19(4), page 1132 (1981) and W. Ma. *SPIE Conference Proceedings*, V. 333, *Submicron Lithography*, page 19, Santa Clara, Calif., 1982.) Ramped post bake involves oxidizing the resin by gradual heating in the presence of air to crosslink the resist. This post baking is disadvantageous as it consumes time and introduces another step into the processing operation. Crosslinking the unexposed photoresist layer by either mechanism is also disadvantageous since once the resist is crosslinked it cannot be as easily stripped from the surface.

Additionally, crosslinking the unexposed novolak photoresist layers is also required when dry, plasma, or reactive ion etching (RIE) is employed. In certain semiconductor manufacturing operations, an insulating layer, such as silicon dioxide, is formed on the surface of a silicon wafer. The photoresist film is then applied to the insulating layer, exposed and developed. Following this step, the insulating layer is etched away down to the surface of the silicon substrate. Typical wet etchants, such as buffered aqueous hydrofluoric acid solutions containing hydrogen fluoride and ammonium fluoride, result in isotropic etching. Isotropic etching means that the etchant dissolves the insulating layer in all directions including the area under the unexposed photoresist layer. Isotropic etching results, therefore, in an undercutting of the photoresist. As the feature size defined by the imaged photoresist approaches the thickness of the insulating layer to be etched, an isotropic etch can lead to inadequate photoresist protection for the substrate. Reactive ion etching (RIE), however, results in an anisotropic etch, namely preferential etching in a single direction only. Anisotropic etching maintains intact the insulating layer directly under the unexposed photoresist. RIE typically involves the application of a high potential, such as that achieved with the application of a high voltage radio frequency field ($R_F$) to a low pressure chamber creating a glow discharge. A reactive gas such as carbon tetrafluoride, for etching the insulating layer, and optionally an inert gas, such as argon, are introduced into the chamber. The high applied potential results in a glow discharge or plasma containing fluorine radicals and positively charged ions in the chamber. The fluorine radicals react with silicon dioxide insulating layer yielding the volatile reactant silicon tetrafluoride. The evolution of these gases provides a method for removing the insulating layer. The positive carbon tetrafluoride and argon ions become attracted to the negatively charged wafer surface. This ion bombardment assists in activating the surface. The fluorine radicals react much more rapidly with the unprotected surface than those surface areas protected from the ion bombardment by the photoresist. This produces a directional etch and enables the definition of geometries smaller than those attainable with isotropic etching.

Plasma and RIE conditions crosslink novolak-containing photoresists. This crosslinking is caused by the exposure of the resist to deep UV radiation generated by the glow discharge and by the high surface temperatures which can be created with high etch rates. The crosslinked polymer becomes difficult to strip in subsequent processing steps.

Novolak resins can withstand reactive ion etching to a much better degree than most other photoresist resins. The rate of silicon dioxide erosion divided by the rate of photoresist layer erosion for novolak type resins is about 4 to 6 to 1 while other resist resins, such as those based on polymethyl methacrylate, have ratios approaching 1 to 1; meaning that the resist becomes etched away at the same rate as the insulating layer.

Reactive ion etching, even with resistant novolak, may lead, however, to a photoresist layer having a reticulated surface, namely one having peaks and valleys caused by either the ion bombardment or the high surface temperature ("fried"). The depth of the valleys can extend through the resist layer to the silicon dioxide insulating surface and can therefore lead to decreased protection of the silicon wafer.

Another problem with novolak type coupler photoresists is limited transparency. "Transparency" in the context of photoresists, and as used herein, refers to the ability of a resist layer to allow the passage of exposing radiation to the sensitizer for initiation of its chemical conversion. If a photoresist is opaque, and not transparent, to a certain radiation wavelength, the coupler resin and not the sensitizer absorbs the radiation. This absorption by the resist does not result in a useful chemical reaction. Novolak type resins are transparent to near UV radiation, however, the transparency of these resins is significantly decreased over the mid UV wavelength range and only a very small, partially transparent window exists at about 250 nanometers in deep UV. Therefore, phenolic resins are transparent only over the near UV, and generally opaque over the mid and deep UV.

The strong absorption of novolak type resins over most of the deep UV makes them suitable as photomasks rather than as transparent photoresists when such exposing radiation is employed. (See Lin, et al, *AZ1350J Deep-UV Mask Material,* IBM Research Center, Yorktown Heights, NY, SPIE, Vol. 174, *Developments in Semiconductor Microlithography,* IV, page 114 (1979).)

In order to obtain improved image resolution, depth of field focusing and silicon wafer throughput, the state of the art is moving in the direction of shorter wavelength radiation such as deep UV. Since conventional photoresists are not transparent over such wavelengths, those in the art are seeking improved positive photoresists which are useful with such wavelengths. (See M. L. Long, *Practical Deep Ultraviolet—The Multilayer Approach,* SPIE Proceedings, Vol. 333, page 54, Santa Clara, Calif., March 1982.)

Other disadvantages of phenolic positive photoresist systems include the cost of the resin, the difficulty in reproduceably synthesizing the systems and the waste of the resin and sensitizer upon spin casting due to the high solids content (about 30 percent by weight) needed for adequate film thicknesses.

Attempts have been made to improve the thermal stability of conventional positive photoresists. U.S. Pat. No. 3,964,908 describes a process for forming an image using a dimethylglutarimide polymer having high thermal stability. The photoresist film is formed directly on the substrate surface by reacting a film of a dimethacrylic acid-containing polymer with gaseous ammonia, methyl or ethyl amine at low pressure in a heated oil bath. It is contended that this in situ formation of a positive photoresist film on the surface is advantageous over spin casting a preformed resist formulation of the same coupler resin dissolved in a solvent onto the substrate because of the negligible solubility of such polymers in commonly used non-reacting solvents. This photoresist system does not contain a sensitizer because known photosensitizers thermally decompose at temperatures below that used in the in situ polymerization reaction used to form the resist.

The absence of a photosensitizer hampers the photospeed of such a system and requires higher doses of exposing radiation and/or longer exposure times to the radiation in order to cause the polymer chain itself to degrade. This in situ approach also suffers because the synthesis route for the preparation of the polymer is complex and difficult to control and use in conventional semiconductor processing. Also, certain dopants, such as phosphorous, which are incorporated into silicon wafers to increase electrical properties, are known to be amine sensitive. Therefore, the introduction of ammonia or alkylamines to form such photoresists in situ can interfere with the dopants and lead to the alteration of the electrical properties of the device sought to be improved with the dopants. Furthermore, when dimethylglutarimides are prepared from alkylamines, the resulting polymers are not soluble in aqueous developing or stripping solutions.

Workers in the art are also attempting to develop photoresist systems cabable of obtaining micrometer to submicrometer images on non-uniform substrate surfaces having varied topographies and reflectivities. Variations in the substrates thickness limit the ability to obtain good resolution with single layer photoresist systems. Multilevel or multilayer photoresist systems have been proposed to solve this problem, however, at the present time, no multilayer photoresist systems capable of micrometer to submicrometer image resolution are commercially available. Multilevel photoresists involve segregating the imaging and protection function of a photoresist system into two or more discrete film layers. Typically a bottom planarizing layer of sufficient thickness is applied to the surface to cover all the surface features creating a flat or planar surface. A thin layer of a different photoresist is then deposited on the planarizing sublayer. Sometimes an intermediate layer, between the planarizing layer and thin top layer, is also employed. The object of a multilayer resist is to expose and develop the thin top layer, achieving enhanced resolution, without exposing the underlying intermediate layer and planarizing layers. This can be accomplished if the layers are not sensitive to the same exposing radiation. After the thin top layer is exposed and developed forming a high resolution image, this image is used sequentially as a photomask for the adjacent intermediate or planarizing layers. The transfer of the image pattern from the top layer and intermediate layer down through the thicker planarizing layer may be accomplished by dry plasma etching or by deep UV exposure and development.

When plasma etching is used for developing the planarizing layer, an intermediate layer is typically present. The planarizing layer is coated with an intermediate layer of an inorganic material, such as silicon dioxide, silicon nitride or silicon, which is resistant to oxygen plasma etchant. After the images are formed in the thin top layer, the wafer is subjected to a carbon tetrafluoride etch. The intermediate layer is etched by the carbon tetrafluoride plasma using the top layer images as a mask. The wafer is then subjected to an anisotropic oxygen plasma etch. The previously etched intermediate layer then becomes the mask for the anisotropic oxygen plasma etching of the planarizing layer. The thin top layer and the intermediate layer are, therefore, utilized as sequential masks by altering the etching conditions.

Another multilayer approach known as the portable conformable mask technique (PCM), utilizes a high molecular weight polymethyl methacrylate as the planarizing layer. The polymer undergoes degradation upon exposure to deep UV radiation but are transparent to near UV radiation. A conventional novolakdiazoketone positive resist is deposited as a coating on the planarizing layer and subjected to near UV exposure and developed to form the mask for the planarizing layer. The polymethyl methacrylate planarizing layer is then exposed to deep UV radiation and developed as by the use of an organic solvent developer such as methylethyl ketone or chlorobenzene.

This PCM approach results in a problem not encountered with trilevel photoresist systems utilizing an intermediate layer. The polymethyl methacrylate planarizing layer and the novolak based thin top layer mix and lead to the formation of an insoluble interfacial product referred to herein as an interfacial scum. This interfacial scum must be removed before the development of the planarizing layer can occur. Removal of the interfacial scum can be accomplished by either a dry plasma etching step or by a vigorous separate development step. This adds undesirable processing steps and time to the PCM technique. Furthermore, the separate development step can threaten the integrity of the existing images.

The use of organic solvents to develop the planarizing bottom layer also presents a problem in that these solvents pose potential health, flammability, and environmental problems. In addition, the solvents can cause the polymer film to swell thereby reducing the resolution of the formed images. The use of polymethyl methacrylate as a planarizing layer also suffers from a thermal stability (low glass transition temperature) and plasma etch resistance standpoint. Polymethyl methacrylate is not a sufficient masking material for use in ion implantation and dry plasma etching procedures. The high temperatures generated during dry etching may exceed the glass transition temperature of polymethyl methacrylate resulting in loss of image resolution due to image flow. Wet etching can circumvent the problems encountered with dry etching polymethyl methacrylate, however, dry etching may lead to other problems such as the loss of adhesion of the images from the substrate.

It is therefore an object of this invention to provide a positive photoresist system which solves the problems encountered by those skilled in the art with conventional positive photoresists.

It is also an object of the invention to provide a positive photoresist system having high thermal stability and good image resolution without the need for subsequent film hardening.

It is a further object of the invention to provide a positive photoresist system having excellent transparency over a wide range of exposing radiation and particularly over the entire ultraviolet wavelength spectrum.

It is also an object of the invention to provide a positive photoresist system having resistance to reticulation upon reactive ion etching.

Additionally, it is an object of the invention to provide a positive photoresist system that is simple to prepare and apply, as by spin casting, to deposit an adherent, uniform film, resistant to changes in physical properties over time, developable in aqueous base, easily stripped from the surface, and which does not increase processing times or costs.

Furthermore, it is an object of the invention to provide a positive photoresist system useful as a planarizing layer in a multilayer resist system which obviates the need for additional processing steps by eliminating interfacial mixing of the layers as in conventional multilayer resist systems.

SUMMARY OF THE INVENTION

A thermally stable, positive photoresist system, containing a partially aqueous-soluble imidized acrylic polymer in a non-aqueous solvent, capable of being spun cast onto a substrate to deposit an adherent film capable of high image resolution is provided. A critical aspect of the invention is the discovery that a preformed, partially water-soluble imidized acrylic polymer having a high degree of thermal stability can be dissolved in non-reactive, non-aqueous solvent systems to form effective positive photoresist systems, and that such systems unexpectedly possess improved properties as compared with conventional positive photoresist systems.

Other objects and advantageous of the positive photoresist system of the present invention will become more apparent to those skilled in this art upon the examination of the detailed description and examples that follow.

DETAILED DESCRIPTION OF THE INVENTION

We have found that preformed, partially aqueous-soluble, imidized acrylic polymers, referred to herein as "polyglutarimides", can be dissolved in non-reactive, non-aqueous solvents to form a positive resist system that can be deposited as an adherent film on a substrate capable of high image resolution. When the positive photoresist system is utilized as a single layer resist, sensitizers may be added to the system to provide transparency and increased photospeed over a wide wavelength range of exposing radiation. When the system is utilized as a planarizing layer in a multilayer resist system, the system can be formulated with or without photosensitive compounds, depending on the means utilized to expose and develop the images on the planarizing layer.

The polyglutarimides which are the coupler resin of the positive photoresist system of the present invention include partially aqueous soluble imidized acrylic polymers as described in U.S. Pat. No. 4,246,374 to Kopchik, the disclosure of which is incorporated in pertinent part by reference herein. The polyglutarimide polymers have at least about 5 percent by weight glutarimide units of the following structural formula:

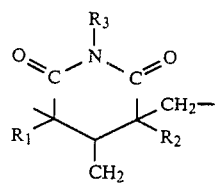

where $R_1$, $R_2$ and $R_3$ independently represent hydrogen or unsubstituted or substituted alkyl, aryl, aralkyl, or alkaryl hydrocarbons having from one to twenty carbon atoms or mixtures thereof.

Polyglutarimides are formed by reacting an acrylic polymer containing units derived from esters of acrylic or methacrylic acid, such as polymethyl methacrylate homopolymer or copolymers of polymethyl methacrylate, with ammonia, primary amines or mixtures thereof. In order for the polyglutarimide to be useful as the coupler resin in an aqueous base developable and strippable, positive photoresist system, the polyglutarimide must be at least partially soluble in aqueous base. The polyglutarimide will be soluble in aqueous base developing solutions when at least about 20 mole percent of the $R_3$ substituents, and preferably from about from 50 mole percent to about 100 mole percent of the $R_3$ substituents, are hydrogen. The $R_3$ substituents of the polyglutarimide will contain at least about 50 mole percent hydrogen when ammonia is used as a single reactant with the acrylic polymer. When mixtures of ammonia and alkyl amines are used to react with the acrylic polymer to form the polyglutarimide, the $R_3$ substituents of the polyglutarimide will be both hydrogen and alkyl groups. Other beneficial physical properties of the polyglutarimides may be obtained by adjusting the ratio of ammonia to alkyl amine reactant in the reactant mixture. In the practice of the invention, it is preferable to prepare the polyglutarimides by imidizing polymethyl methacrylate with ammonia to obtain the desired degree of aqueous base solubility and other physical properties.

The polyglutarimides may be prepared by a continuous extrusion process, as described in U.S. Pat. No. 4,246,374. The degree of imidazation of the polyglutarimide can be adjusted by varying the process conditions such as residence time, pressures and temperatures. Polyglutarimides having up to about 95 mole percent imidization can be readily achieved by converting the ester moieties of the acrylic polymer to glutarimide moieties.

The physical properties of the resulting photoresist film can also be adjusted by varying the molecular weight of the polyglutarimide coupler resin. The molecular weight of the resulting polyglutarimide is typically close to the molecular weight of the precursor acrylic polymer. Therefore, by selecting an acrylic polymer of known molecular weight and forming a polyglutarimide, the film properties of the positive photoresist system of the present invention can be optimized for each admixture of polyglutarimide and solvent with or without the addition of a photoactive sensitizer. Typically the molecular weight of the polyglutarimide coupler resin of the present invention ranges from about 4,500 weight average molecular weight to about 200,000 weight average molecular weight. In order to achieve optimum development of the positive resist films of the invention in an aqueous base developing solution, the molecular weight of the polyglutarimide resin should preferably be at least about 50,000 weight average molecular weight.

One of the distinguishing characteristics of polyglutarimides which makes them especially useful as coupler resins in a positive photoresist system is their high degree of thermal stability. The thermal stability of polyglutarimides increases with increasing percent imidization. A 95% imidized polyglutarimide derived from ammonia has a glass transition temperature (Tg) of about 250° C. and a Tg midpoint of 231° C. as determined by Differential Scanning Calorimetry (DSC). A nearly completely imidized polyglutarimide (95% imidization) derived from N-methylamine has a Tg of about 180° C. Depending on the process conditions, the ratio of ammonia to alkyl amine reactant, the acrylic polymer precursor, and the extent of imidization of the acrylic polymer precursor, the thermal stability of the polyglutarimide, as determined by its glass transition temperature (Tg) or VICAT softening point (ASTM DI 525-70), can range from about 130° C. up to about 250° C.

It is preferred that the polyglutarimides used as coupler resins in positive photoresist systems of the present invention be at least about 80 percent imidized with a Tg of a least 140° C., preferably up to about 180° C., and in certain cases, as for example when reactive ion etching is to be utilized, even more preferably up to about 240° C.

The thermal stability of the photoresist film is especially important when image resolution on the order of from less than about one micrometer to about 1.5 micrometers is desired. As described above, flow of photoresist films is a problem with conventional systems when such a high degree of image resolution is desired, and when ion implantation of the silicon wafer surface or reactive ion etching is utilized. For example, ion doping or implantation of the silicon surface is used in certain cases to improve the electrical conductivity of the silicon wafer. Doping of the silicon is achieved by implanting conductive ions, such as phosphorus or boron ions, into the exposed silicon wafer surface. The amount of such ions that can be implanted into the silicon surface is a function of the thermal stability of the photoresist layer. Ion implantation leads to high film surface temperatures which can lead to the deformation of images formed using conventional positive photoresists. If a photoresist begins to flow during ion implantation, the level of doping and electrical properties of the wafer, as well as image resolution, will suffer.

The thermally stable polyglutarimides of the present invention can resist flow under ion implantation conditions. No additional hardening of the photoresist, as by crosslinking, is necessary to improve the thermal stability of the photoresist layer. Accordingly, the extra processing steps and additional processing time needed with conventional phenolic type photoresists are avoided. Furthermore, since the polyglutarimide does not require hardening, stripping the resist is not made more difficult.

In addition, reactive ion etching also requires a highly thermally stable photoresist film. The rate of substrate erosion to resist erosion with the polyglutarimide based positive photoresist of the invention is comparable to novolak type resins, about 4 to about 6 to 1 when silicon dioxide is being etched. This ratio is much higher than with other types of conventional organic polymers. The resistance of the photoresist to reactive ion etching leads to fast etch times, increases wafer throughput and lowers processing cost. The polyglutarimide positive resists of the invention are superior to novolak resins for reactive etching because no reticulation of the resist layer has been found to occur by scanning electron microscopic examination. The improved resistance to reticulation means that the positive photoresist film of the invention is a more effective shield to anisotropic etching than novolak type resins.

A critical aspect of the invention is the discovery that the polyglutarimides are capable of being dissolved in non-aqueous, non-reactive solvents and that the system can be used to deposit an adherent, high quality, aqueous base developable, positive resist film on a substrate for lithographic applications. When the positive photoresist system is used as a single layer resist, and optionally when it is used as the planarizing layer in a multi-layer resist, conventional positive acting photosensitizers have been found to be compatible with the polyglutarimide resin and soluble in the same solvents in which the polyglutarimide are soluble. These photosensitizers include diazo oxides such as the 4′,2′,3′-trihydroxy benzophenone ester of 1-oxo-diazo naphthalene-5-sulfonic acid (SOX) having the structural formula shown on page 5 herein.

Other useful sensitizers can be formed from quinone diazides such as benzoquinone diazides such as benzoquinone 1,2-diazide-4-sulfonylchloride; and napthoquinone diazides such as napthoquinone-1,2-diazide-5-sulfochloride, napthoquinone-1,2-diazide-4-sulfochloride, napthoquinone-2,1-diazide-4-sulfochloride, and napthoquinone-2,1-diazide-5-sulfochloride. Other diazo compounds other than the diazo oxides or quinone diazide compounds may also be suitable reagents for forming positive sensitizers which can be used in this invention.

Further, it is possible to add certain additives to increase the sensitivity of quinone diazide sensitizers as described in U.S. Pat. No. 3,661,582 as well as the dibasic carboxylic acids, monobasic unsaturated aromatic acids, hydroxyphthalic acids alone or in combination in amounts of from 0.01% to about 15% on a weight basis based on the weight of the polyglutarimide coupler resin as disclosed in U.S. Pat. No. 4,009,033.

We have found that mixtures of the polyglutarimides and these positive sensitizers in weight ratios of from about 99:1 to about 1:1 can be spun cast from a suitable solvent to give high quality clear films with no hazing or other indicia of component separation due to incompatibility. Typically the level of the sensitizer compound ranges from about 5 to about 30 weight percent based on the weight of the polyglutarimide coupler resin.

The preferred sensitizer compounds used in the positive photoresist system of the invention was determined by matching its absorption spectrum to the particular wavelength range of the desired exposing radiation.

Suitable non-aqueous, non-reactive solvents useful for dissolving polyglutarimides and sensitizers include:

amide, polar, aprotic solvents such as dimethylformamide (DMF), dimethylacetamide (DMAC), N-methylpyrrolidinone (NMP), and dimethylpropyleneurea (DMPU);

hydroxylic, polar, protic solvents such as cellosolve acetate (CA), tetrahydrofurfuryl alcohol (THFA), acetol, methyl carbitol (MeCarb) and 2-methoxy ethanol;

polar, aprotic, ketonic solvents such as cyclopentanone (CP);

small chain, polar, carboxylic acids such as acetic acid and formic acid;

polar, basic, ethers such as n-alkyl morpholines such as n-methyl morpholine and n-ethyl morpholine, and tetrahydrofuran; and mixtures of the above.

Other compounds, which are not, by themselves, solvents for polyglutarimides, can be combined with one or more of the above-described solvents to form a solvent system which can dissolve the polyglutarimide and sensitizers and aid in spin casting the photoresist film. Some examples of these compounds include acetyl acetone, 1-methoxy-2-propanol, cyclohexanone, chlorobenzene (CB), conventional solvent, xylene, toluene, butyl acetate, 1,2-dimethoxyethane, ethylene glycol mono methyl ether, 2-4-pentanedione, and the like.

Preferred solvent systems of the invention include mixtures of DMF/CS/chlorobenzene (CB), THFA/CS, cyclopentanone, THFA/methyl acetoacetate, and chlorobenzene/2-methoxy ethanol.

The polyglutarimide coupler resin is typically dissolved in the solvent system to a concentration of from about 5 to about 30 weight percent.

The positive photoresist system is capable of being spun cast from the solution to deposit an adherent film on an oxide coated, nitride coated or uncoated silicon wafer or aluminum coated substrate. The thickness of the photoresist film can be controlled by adjusting the level of coupler resin and/or sensitizer solids in the mixture, the level and type of solvent, and by varying the spin speed.

Any conventional spin casting method such as those described in *Integrated Circuit Fabrication Technology*, D. J. Elliott, McGraw-Hill Book Company, 1982, chapter 6, pages 124–144, can be utilized with the photoresist system of the invention.

Typically the wafer is placed on a rotating disc such as a Headway ® wafer spinner and rotated at speeds of from about 3000 to 7000 revolutions per minute. The photoresist system is deposited onto the wafer over a few second period by either a continuous or dropwise additon while the wafer is stationary, or while it is spinning.

It is also possible to pretreat the wafer with a primer immediately before spin casting the photoresist to increase the adhesion of the polyglutarimide photoresist film onto the surface. We have found that primers such as hexamethyldisilazane (HMDS) and beta-3,4-epoxy cyclohexylethyl trimethoxysilane ("CHOES") can be used compatibly with the polyglutarimide photoresist systems of the invention. This primer may optionally be included as an additive, at levels on the order of from about 1 to 15 weight percent based on the amount of coupler resin, in the photoresist system to improve adhesion and reduce cracking of the film (crazing) during development. We have found that when the preferred solvent systems are used, primers may not be necessary to improve the adhesion of the film onto the substrate and that if a primer is used conventional primers such as HMDS are preferred. However, when less preferred solvent systems are utilized, we have found that other primers, such as beta-3,4 epoxy cyclohexylethyl trimethoxysilane increases the adhesion of the film onto the substrate.

Using these photoresist systems and procedures, uniform, striation-free films with thicknesses from less than about 0.1 micrometers to greater than 3 micrometers can be deposited on a substrate. These films are free from pinholes and voids which could lead to reduce quality and yields during processing. For most imaging applications, the film thickness will range from about 1 micrometer to about 1.5 micrometers.

The positive resist film containing the polyglutarimide and non-aqueous solvent can be imaged by exposure to a source of energy, such as ultraviolet light, e-beam, ion beam, X-ray and the like, that increases the dissolution rate of the polyglutarimide in a developer followed by developing the exposed film in the developer. A requirement for the positive photoresist system utilizing photosensitizers is that the film deposited on the substrate is transparent to a wide wavelength range of exposing radiation. This means the film does not significantly absorb the exposing radiation at the expense of the sensitizer. The solvents used in the photoresist system of the invention are also selected so that they do not interfere with the ability of the sensitizer to absorb the exposing radiation wavelengths applied.

We have found that the positive photoresist systems of the present invention form films that are transparent over a broad ultraviolet light range. The ability of the photoresist to be transparent over near, mid and deep UV allows for its use with conventional near UV exposure devices as well as state of the art, deep UV devices. Using deep UV allows achieving improved image resolution, depth of field focusing to alleviate image distortion problems upon thermal processing, and high semiconductor throughput. The excellent transparency of the positive photoresist films of the photoresist system of the invention is superior to conventional phenolic or novolak type resin photoresist films which are only completely transparent to near UV exposure.

Exposed polyglutarimide based positive photoresists can be developed in commercially available aqueous alkaline developers such as tetramethyl ammonium hydroxide, sodium hydroxide and the like. The developer type used and its strength is a function of the type of polyglutarimide resin used to formulate the positive photoresist system and for complete development of images in a given period of time. With the photoresist systems of the invention complete development at 20°–24° C. in about 1 minute has been achieved.

Analysis of imaged silicon wafers by means of a scanning electron microscope indicates that excellent resolution and adhesion of the resist to the substrate with retention of high image resolution is achievable with the positive photoresist system of the present invention.

Once the positive photoresist is exposed to radiation and developed or imaged, the excellent thermal stability of the polyglutarimide allows for the use of high temperature post baking, ion implantation and reactive ion etching, also commonly referred to as dry or plasma etching, operations. Post baking refers to a procedure for increasing resist adhesion to the substrate prior to wet etching by placing imaged wafers directly in a forced air oven at 150° C. to 180° C. for 15 minutes to 1 hour, and typically for about one half an hour. Post baking also increases wafer throughput compared to normal resist hardening operations. Depending on the glass transition temperature of the polyglutarimide coupler used, the imaged wafers can be directly hard baked at temperatures of from about 150° C. to about 220° C. without image distortion. This hard baking may improve the resistance of the imaged film to RIE and its adhesion to the substrate.

We have also found that the photoresist system of the invention is stable upon storage and can easily be stored for extended periods of time of at least 2 weeks at elevated temperatures, on the order of about 50° C., and at least a few months at ambient temperature, without any noticeable change in performance.

the positive photoresists have also been found to be suitable as a planarizing layer in a multilayer resist system. In one embodiment of the multilayer system, the top layer can be any positive or negative photoresist that is photoactive to radiation sufficient to expose the top layer and sufficiently opaque to the radiation used to expose the planarizing polyglutarimide layer. In another embodiment, we have found that it is also possible to utilize photosensitizers sensitive to the same exposing radiation wavelengths in both the top resist layer and the planarizing layer and to utilize different developers or a developer of different strengths to preferentially and sequentially develop each layer independently. It is also possible to utilize a polyglutarimide resist without a photosensitizer as the planarizing layer and to etch the planarizing resist through the mask created by the imaged top layer.

The top layer resist may be applied directly by spin coating onto the bottom planarizing layer either before or after the planarizing layer is soft baked. In order to achieve optimum image resolution, the top layer should be as thin as possible while also being operable as a good mask for the bottom planarizing layer. After the top layer is exposed and developed, the planarizing layer may be exposed through the mask, formed by the imaged top layer, as in a portable conformable mask technique. When the planarizing layer is imaged using plasma etching, no photosensitizer need be present in the planarizing layer film. When the planarizing layer is exposed to deep UV radiation, the planarizing layer resist can also be formulated with deep UV sensitizers such as ortho-nitrobenzyl esters or alternatively without any photosensitizer being present. The exposed planarizing layer can then be developed using an aqueous base developing solution. The top resist film may be retained or removed as desired during the development of the planarizing layer depending on the strengths of the developer solution employed to develop the exposed planarizing layer. The polyglutarimide planarizing layer can also be used with RIE.

We have found that the polyglutarimide planarizing layer film is resistant against mixing with the thin top resist film layer. As a result, interfacial scumming is not a problem and no extra processing steps are required.

The following examples are presented solely to illustrate the invention and should not be considered to constitute limitations on the invention, many variations of which are possible without departing from the spirit or scope thereof.

EXAMPLE 1

Preparation of Polyglutarimide

A polyglutarimide was prepared in a continuous extrusion device according to the process described in U.S. Pat. No. 4,246,374. A high molecular weight polymethyl methacrylate homopolymer was introduced via the feed port of a twin-screw counter-rotating extruder at a rate of 108 pounds per hour. Ammonia was introduced into the extruder barrel at a rate of 40.7 pound per hour at a pressure of 1400 psig. The ammonia contacted and mixed with the polymethyl methacrylate as it moved forward through the reaction zone at an extruder rpm of 225. The average barrel temperature was 560° F. The unreacted reagents and volatile products and by-products of the reaction were removed under vacuum at the vent. The imidized polymer product left the extruder through the die in melt form, non-foamed and essentially free of volatile materials. The polyglutarimide had a weight average molecular weight of 71,000 as determined by gel permeation chromatography and contained 58 mole percent ammonia-derived (N-H) glutarimide units and 42 mole percent methylamine-derived (N-CH$_3$) glutarimide units. The Vicat temperature of the polyglutarimide was measured (ASTM DI 525-70) to be 199° C. and the glass transition temperature, measured by Differential Scanning Calorimetry, had a mid point between 192° and 193° C.

EXAMPLE 2

Preparation and Application of Positive Resist Systems

The following presents the general procedure used to prepare and use the positive resist systems of the invention. Table 1 presents the formulations and processing conditions used to formulate and use the positive resist systems. Four solutions (Samples A-D) of the polyglutarimide, prepared according to example 1, in various solvent systems were prepared by adding the polyglutarimide to the solvent with stirring and heating until no solid polyglutarimide was visible. Each solution was then cooled to room temperature and a conventional photosensitizer, referred to herein as SOX, was added to each of the solutions to form the positive resist systems. Each system was then filtered through a 1 micrometer Fluoropore ® filter to remove solid particulates.

Four 3 inch diameter silicon dioxide coated (5,000-10,000 Angstrom thick) silicon wafers were prebaked at 200° C. and primed as follows. One to two milliliters of HMDS was applied via an automatic pipette to the prebaked wafers and each of the wafers were then spun at 3000 rpm on a Headway ® spinner for 30 seconds. One milliliter of each of the resist systems (samples A-D) was applied to each of the four primed wafers using a syringe. Each wafer was then spun at 3,000 rpm for 60 seconds on the Headway ® wafer spinner, at a relative humidity of at least 50%, to cast the resist films. Each wafer was then softbaked at 90° C. in a Blue M forced air convection oven for the times listed in Table 1 to form films of approximately one micrometer thickness. Each wafer was removed from the oven, cooled to room temperature, and exposed through a quartz photomask having image patterns ranging from 0.75 micrometers to 5 micrometers in width on a HTG contact printer. Each wafer was exposed to UV radiation as shown in Table 1. Each wafer was then developed by immersion in an aqueous base developer solution at 20°-24° C. as set forth in Table 1 such that the exposed portions of the film were completely removed as determined by optical and scanning electron microscopy. Each wafer was then removed from the developer, rinsed for 10 to 15 seconds under a continuous stream of deionized water and dried using forced air. The adhesion of the unexposed film and the resolution of the developed images were ascertained by optical and scanning electron microscopy. Complete adhesion of the unexposed film was found in all cases. Complete adhesion as used herein means that the images developed on the wafer remained on the wafer after development. The resolution achieved is shown in Table 1.

EXAMPLE 3

Multilayer Resist System

The planarizing positive resist system containing the polyglutarimide used in the multilayer resist were formulated using the polyglutarimide described in example 1. The formulations of the planarizing positive resist systems (samples E-I) are illustrated in Table 2. Five silicon wafers, 3 inches in diameter coated with silicon dioxide, were primed with HMDS as explained in example 2. Each of the polyglutarimide planarization resist formulations (samples E-I) were then spun cast onto the primed wafers using the procedure described in example 2 and softbaked as indicated in Table 2 to form the planarizing films. Onto each film, a one milliliter solution of a conventional, Shipley Company 1450B positive resist formulation (novolak plus diazoketone sensitizer) was spun at 3,000 rpm for 60 seconds to form a thin top film of about 0.5 micrometer thickness. Each wafer was softbaked at 90° C. for 30 minutes in the Blue M forced air convection oven. Each wafer was then exposed as indicated in Table 2 using a HTG contact printer and a quartz photomask making image patterns ranging from 0.75 micrometers to 5 micrometers in width. Each wafer was then developed at 20°-24° C. by immersion in a developing solution as set forth in Table 2. Each wafer was removed from the developer, washed and dired as set forth in example 2 to form the photomask for the planarizing layer. Each wafer was then exposed through the top layer photomask as set forth in Table 2. Each wafer was then developed, washed and dried as in example 2 and according to the developing conditions set forth in Table 2. The adhesion and resolution of the developed images were determined as in example 2. Complete adhesion of the planarizing layer to the substrate was observed in all cases and no interfacial scum was observed. The resolutions are set forth in table 2.

EXAMPLE 4

Thermal Stability

The bilevel resist system, sample E of example 3, was baked at 180° C. for one hour and examined under the scanning electron microscope. While some rounding of the image sidewall profile was observed, the image resolution did not change.

EXAMPLE 5

Comparative Etching Resistance

This example compares the reactive ion etching resistance of the positive resist system of the invention with a conventional novolak-type positive resist. The substrates used were 3 inch diameter silicon wafers having 5,000 Angstrom thick silicon nitride coatings onto which was deposited a 10,000 Angstrom thick aluminum coating. The wafers were primed as described in example 2 with the HMDS primer without a solvent which was spun onto the aluminum coating at 3000 rpm for 30 seconds. The polyglutarimide positive resist used was that of sample D, 10 wt. % solution of polyglutarimide dissolved in a 66 wt. % chlorobenzene (CB) 33 wt. % 2-methoxyethanol solvent containing 12.5% of the SOX triester photosensitizer, based on the weight of polyglutarimide, and containing 5 wt. % of the CHOES additive. This resist system was spun cast onto the primed wafers at 3,000 rpm for 60 seconds at 52% relative humidity. The wafers with the deposited resist films were softbaked in a forced air oven for one half an hour at 90° to 95° C. The resulting film had a thickness of 1.3 micrometers. A conventional novolak-diazoketone positive resist system was also spun cast onto identical primed wafers and softbaked.

The wafers were then exposed to near UV radiation through a contact photomask using the HTG printer. The polyglutarimide resist of the invention was exposed to 69 mJ/cm$^2$ of near UV radiation and developed in a 2.5/1 Vol/Vol solution of water and the Shipley MF312 developer. The polyglutarimide imaged wafers were then postbaked at 180° C. for one hour. The novolak imaged wafers were postbaked at 130° to 135° C. for 45 minutes.

Reactive ion etching was then conducted on each imaged wafer using a Plasmatherm batch etcher under the etching conditions listed in table 3. Boron trichloride (BCl$_3$) was used to scavenge water and to aid in the removal of the aluminum oxide layer. Chlorine (Cl$_2$) gas was used as the active etching agent. The flow rate of the chlorine gas determined the severity of the etching conditions. The wafers were etched until no aluminum was visibly present. After etching, the wafers were removed from the batch etcher and quenched in water to prevent post-etching corrosion of the aluminum layer under the resist. The film thickness of the photoresist and the aluminum layers was measured before and after etching using a Ten-Cor Alpha Step ® profilometer to determine the relative etch rates of the samples. Each sample was repeated at least twice and the relative etch rates shown in Table 3 are average relative etch rates. The film quality was determined and reticulation was determined by visual and scanning electron microscopy.

Following reactive ion etching, the polyglutarimide resist was stripped from the wafer using an aqueous base. The novolak resists were not capable of being stripped from the wafer using conventional wet stripping agents.

TABLE 1

RESIST SYSTEM

| Sample | Polyglutarimide Wt. % | Solvent Type | Solvent Composition Wt. % | Sensitizer Type | Sensitizer Wt. %[1] in Resist | Additive Type | Additive Wt. % in Resist |
|---|---|---|---|---|---|---|---|
| A | 12.0 | DMF/CB/CS | 30/55/35 | SOX | 12.5 | None | |
| B | 12.0 | THFA/CS | 50/50 | SOX | 12.5 | CHOES | 5 |
| C | 10.7 | CP | 100 | SOX | 12.5 | CHOES | 5 |
| D | 10.0 | CB/2-methoxy ethanol | 66/33 | SOX | 12.5 | None | |

| Sample | Soft Bake Time (Minutes) | Exposing Radiation Type | Exposing Radiation Dose mJ/cm$^2$ | Developing Conditions Developer Type (Vol/Vol) | Developing Conditions Time (seconds) | Imaging Resolution (micrometer) |
|---|---|---|---|---|---|---|
| A | 30 | near UV | 69 | H$_2$O/Shipley[2] MF312 2.75/1 | 50–60 | Approx. 1 |
| B | 45 | near UV | 69 | H$_2$O/Shipley MF312 2.75/1 | 50–60 | Approx. 1 |
|   |    | deep UV | 90 | H$_2$O/Shipley MF312 2.75/1 | 50–60 | Less than 1 |
| C | 30 | near UV | 69 | H$_2$O/Shipley MF312 2.75/1 | 90 | Approx. 1 |
|   |    |         |    | H$_2$O/Shipley 351[3] 2.5/1 | 60 | Less than 1 |
| D | 30 | near UV | 69 | H$_2$O/Shipley MF312 2.5/1 | 60 | Approx. 1 |

[1]Wt. % based on weight of polyglutarimide.
[2]Shipley MF312 is an aqueous base containing tetramethyl ammonium hydroxide
[3]Shipley 351 is an aqueous sodium hydroxide solution

TABLE 2

PLANARIZING RESIST SYSTEM

| Sample | Polyglutarimide Wt. % | Solvent Type | Solvent Composition Wt. % | Sensitizer Type | Sensitizer Wt. %[1] | Additive Type | Additive Wt. % | Softbake °C. | Softbake Minutes | Film Thickness Micrometers |
|---|---|---|---|---|---|---|---|---|---|---|
| E | 10.0 | CB/2-methyl ethanol | 66/33 | BONP[2] | 15 | None | | 90 | 30 | 1.20 |
| F | 10.7 | CP | 100 | None | | None | | 150 | 30 | 2.0 |
| G | 10.7 | CP | 100 | None | | 1b[3] | 5 | 140 | 60 | 2.3[4] |
| H | 10.7 | CP | 100 | SOX | 12.5 | None | | None | | 1.6 |
| I | 10.0 | CP | 100 | SOX | 12.5 | None | | None | | 1.8 |

| Sample | Exposure of Top Layer Type | Exposure of Top Layer Dose MJ/CM$^2$ | Development of Top Layer Type (Vol/Vol) | Development of Top Layer Time (Second) | Exposure of Planarizing Layer Type | Exposure of Planarizing Layer Dose mJ/cm$^2$ | Development of Planarizing Layer Type (Vol/Vol) | Development of Planarizing Layer Time (Second) | Image Resolution (Micrometers) |
|---|---|---|---|---|---|---|---|---|---|
| E | near UV | 76 | H$_2$O/Shipley 351 5/1 | 30 | deep UV | 1500 | H$_2$O/Shipley 312 2/1 | 70–90 | Approx. 1 |
| F | near UV | 63 | H$_2$O/Shipley 351 5.5/1 | 60 | deep UV | 3000 | H$_2$O/Shipley 312 3.25/1 | 60 | Approx. 1 |

TABLE 2-continued

| | | | | | | | | | |
|---|---|---|---|---|---|---|---|---|---|
| G | near UV | 63 | H$_2$O/Shipley 351 6.0/1 | 60 | deep UV | 2000 | H$_2$O/Shipley 312 2.25/1 | 60 | Approx. 1 |
| H | near UV | 63 | H$_2$O/Shipley 351 5.5/1 | 60 | deep UV | 100 | H$_2$O/Shipley 312 3/1 | 60 | Approx. 1 |
| I | near UV | 70 | H$_2$O/Shipley 351 5.5/1 | 60 | none | | H$_2$O/Shipley 312 3/1 | 60 | Approx. 5 |

[1] Wt. % based on polyglutarimide
[2] BONP = bis (o-nitrobenzyl) pimelate or bis (o-nitrobenzyl)-1,7 heptane dioate
[3] 1b = 1-borneol
[4] Obtained by spinning resist system two times.

TABLE 3

| | | Etch Conditions | | | | | | |
|---|---|---|---|---|---|---|---|---|
| | | Total | R$_F$ | DC | Gas Flow | | Etch | Average | Film |
| | Resist | Pressure | Power | bias | BCl$_3$ | Cl$_2$ | Time | Relative | Quality |
| Sample | Type | (millitorrs) | (Watts) | (Volts) | (cc/min) | | (minutes) | Etch Rate[3] | After Etching |
| J | P[1] | 27–28 | 425 | −180 | 55 | 6 | 11.75 | 1.9 | No reticulation |
| K | N[2] | 27–28 | 425 | −180 | 55 | 6 | 11.75 | 1.5 | No reticulation |
| L | P | 27–28 | 600 | −231 | 50 | 10 | 5.5 | 2.5 | No reticulation |
| M | N | 27–28 | 600 | −231 | 50 | 10 | 5.5 | —[4] | Reticulation (fried) |

[1] P = polyglutarimide
[2] N = novolak resist
[3] Average relative etch rate is equal to ratio of the etch rate of aluminum layer divided by the etch rate of the resist layer.
[4] Etch rate not determined because of severe reticulation of resist.

What is claimed is:

1. A positive photoresist comprising a preformed, non-crosslinked polyglutarimide polymer formed from an ester of (meth)acrylic acid and having at least five percent by weight glutarimide units of the structure

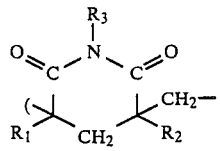

where R$_1$, R$_2$ and R$_3$ independently represent hydrogen or unsubstituted or substituted alkyl, aryl, aralky, or alkaryl hydrocarbons having from one to twenty carbon atoms and where at least 20 mole percent of the R$_3$ substituents are hydrogen, dissolved in a non-aqueous, spinning solvent, and where the photoresist is developable with an aqueous solution.

2. The positive photoresist of claim 1 further comprising a positive acting photosensitizer dissolved in said non-aqueous spinning solvent.

3. The positive photoresist of claim 1 comprising from about 5 to about 30 weight non-crosslinked polyglutarimide and from about 95 to about 70 weight percent non-aqueous, spinning solvent.

4. The positive photoresist of claim 3 comprising from about 10 to about 20 weight percent non-crosslinked polyglutarimide and from about 90 to about 80 weight percent non-aqueous, spinning solvent.

5. The positive photoresist of claim 2 where the concentration of said photosensitizer is from about 5 to about 30 weight percent based on the weight of said preformed, non-crosslinked polyglutarimide.

6. The positive photoresist of claim 2 wherein said photosensitizer is selected from the group consisting of diazooxides, and bis(o-nitrobenzyl)-1,7 heptane dioate.

7. The positive photoresist of claim 1 wherein the polyglutarimide has an atomic ratio of carbon to nitrogen of at least 8 and a glass transition temperature of at least 140° C.

8. The positive photoresist of claim 1 where said preformed polyglutarimide is formed by imidizing a polymethyl methacrylate polymer with ammonia.

9. The positive photoresist of claim 8 wherein said preformed polyglutarimide is formed by imidizing a polymethyl methacrylate polymer with a mixed reactant system comprising at least 20 weight percent ammonia and at least one alkylamine.

10. The positive photoresist of claim 1 wherein the non-aqueous, spinning solvent comprises a non-solvent for polyglutarimides selected from the group consisting of: acetyl acetone; 1-methoxy-2-propanol; cyclohexanone; chlorobenzene; mixtures of ethylene glycol monoethylether acetate, xylene and butyl acetate; xylene, toluene; butyl acetate; 1,2-dimethoxyethane; and ethylene glycol monomethyl ether in combination with one or more of the non-spinning solvents or mixtures thereof selected from the group consisting of: amide, polar, aprotic solvents; hydroxylic, polar, protic solvents; polar, aprotic, ketonic solvents; small chain, polar, carboxylic acids; and polar, basic, ethers.

11. The photoresist of claim 2 wherein the photosensitizer absorbs near, mid or deep UV radiation.

12. A surface comprising an adherent, uniform, aqueous base developable, film having a thickness of about one micrometer, of the photoresist of claims 1 or 2.

13. The surface film of claim 12 having a thickness of about 0.5 micrometer to about 3.0 micrometers.

14. A multilayer photoresist comprising as a planarizing layer the photoresist of claim 1 and at least one other layer capable of being imaged on said planarizing layer.

15. The multilayer photoresist of claim 14 in which the planarizing layer and the adjacent layer deposited on said planarizing layer do not form an interfacial scum.

16. The photoresist of claim 1 being thermally resistant to temperatures of from about 140° C. to about 240° C.

17. The photoresist of claim 1 being resistant to reactive ion etching.

18. A process for forming an image on a surface comprising depositing an adherent positive acting film on said surface from the photoresist of claim 1, exposing a portion of said film to a source of energy that increases the dissolution rate of said polyglutarimide in a developer, and developing the exposed portion of said film with said developer to form said image.

19. The process of claim 18 wherein said film is deposited from said photoresist of claim 2.

20. The process of claim 18 wherein said source of energy is selected from the group consisting of ultraviolet, e-beam, ion beam and x-ray.

21. The process of claim 18 further comprising softbaking said film prior to exposing said film to said source of energy.

22. A process for forming an image on a surface comprising depositing an adherent, planarizing film on said surface forming a second surface, said planarizing film comprising a preformed non-crosslinked polyglutarimide polymer formed from an ester of (meth)acrylic acid and having at least five percent by weight glutarimide units of the structure

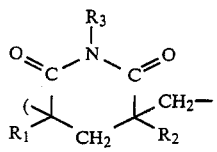

where $R_1$, $R_2$ and $R_3$ independently represent hydrogen or unsubstituted or substituted alkyl, aryl, aralky, or alkaryl hydrocarbons having from one to twenty carbon atoms and where at least 20 mole percent of the $R_3$ substituents are hydrogen, dissolved in a non-aqueous, spinning solvent, depositing a second film capable of being imaged on said second surface, exposing a portion of said second film to a source of radiation, developing the exposed portion of said second film to create a mask on the planarizing film, and transferring said image from said second film through said mask and the planarizing film and onto said surface.

23. The process of claim 22 wherein said second film comprises a positive acting photoresist.

24. The process of claim 22 wherein said image formed on said second film is transferred through said planarizing film onto said surface using reactive ion etching.

25. The process of claim 22 wherein said second film is a negative acting photoresist.

26. The process of claim 23 wherein said planarizing film is exposed to deep UV and developed using an aqueous base developer to transfer said image formed on said second film onto said surface.

27. The process of claim 26 wherein said planarizing film further comprises a photosensitizer sensitive to deep UV.

28. The process of claim 22 further comprising adding at least one layer, intermediate to said planarizing film and said second film, onto said planarizing film, said intermediate layer being resistant to said developing means used to create an image on said second film, and wherein said intermediate layer is developed through said mask formed on said second film to form a second image using plasma or wet etching to form a mask for transferring said second image onto said surface through said planarizing layer.

29. The process of claim 19 wherein said second image on said intermediate layer is transferred onto said surface by dry etching said planarizing layer through said mask formed on said intermediate layer.

30. The spinning solvent of the photoresist of claim 2 comprising a non-solvent for polyglutarimides selected from the group consisting of: acetyl acetone; 1-methoxy-2-propanol; cyclohexanone; chlorobenzene; mixtures of ethylene glycol monoethylether acetate, xylene and butyl acetate; xylene; toluene; butyl acetate; 1,2-dimethoxyethane; and ethylene glycol monomethyl ether, in combination with one or more of the non-spinning solvents or mixtures thereof selected from the group consisting of: amide, polar, aproptic solvents; hydroxylic, polar, protic solvents; polar, aprotic, ketonic solvents; small chain, polar, carboxylic acids; and polar, basic, ethers.

* * * * *